US006606782B2

(12) United States Patent
Min et al.

(10) Patent No.: US 6,606,782 B2
(45) Date of Patent: Aug. 19, 2003

(54) METHOD OF FORMING A CONTINUOUS FREE LAYER SPIN VALVE SENSOR WITH PATTERNED EXCHANGE UNDERLAYER STABILIZATION

(75) Inventors: Tai Min, San Jose, CA (US); Po-Kang Wang, San Jose, CA (US); Moris Musa Dovek, San Jose, CA (US)

(73) Assignee: Headway Technologies, Inc., Milpitas, CA (US)

( * ) Notice: Subject to any disclaimer, the term of this patent is extended or adjusted under 35 U.S.C. 154(b) by 0 days.

(21) Appl. No.: 10/104,778

(22) Filed: Mar. 22, 2002

(65) Prior Publication Data

US 2002/0126429 A1 Sep. 12, 2002

Related U.S. Application Data

(63) Continuation of application No. 09/408,492, filed on Sep. 30, 1999, now Pat. No. 6,385,017.

(51) Int. Cl.⁷ ............................. G11B 5/39; G11B 5/127
(52) U.S. Cl. .................. 29/603.15; 29/603.14; 29/603.18; 29/603.07; 216/22; 216/40; 360/324.1; 360/324.11
(58) Field of Search ................ 29/603.15, 603.14, 29/603.12, 603.16, 603.18, 603.07; 216/22, 40, 74; 360/327.3, 327.31, 327.33, 324.1, 324.11

(56) References Cited

U.S. PATENT DOCUMENTS

| | | | |
|---|---|---|---|
| 5,608,593 A | 3/1997 | Kim et al. | 360/324.12 |
| 5,708,358 A | 1/1998 | Ravipati | 324/252 |
| 5,796,561 A | 8/1998 | Mauri | 360/324.11 |
| 5,828,527 A | 10/1998 | Takada et al. | 360/327.3 |
| 6,262,869 B1 * | 7/2001 | Lin et al. | 360/324.1 |

FOREIGN PATENT DOCUMENTS

JP          2000-101192       *   4/2000

* cited by examiner

*Primary Examiner*—A. Dexter Tugbang
(74) *Attorney, Agent, or Firm*—George O. Saile; Stephen B. Ackerman; Graham S. Jones, II

(57) ABSTRACT

To form a spin valve device, start by forming a gap layer. Form a buffer layer with a layer of refractory material on the buffer layer. Form patterned underlayers including a magnetic material for providing trackwidth and longitudinal bias on the buffer layer comprising either a lower antiferromagnetic layer stacked with a ferromagnetic layer or a Cr layer stacked with a permanent magnetic layer. Form an inwardly tapered depression in the patterned underlayers down to the buffer layer by either ion milling through a mask or a stencil lift off technique. Form layers covering the patterned underlayers that cover the inwardly tapered depression. Form free, pinned, spacer and antiferromagnetic layers. Form conductors either on a surface of the antiferromagnetic layer aside from the depression or between the buffer layer and the patterned underlayers.

18 Claims, 12 Drawing Sheets

METHOD OF FORMING A CONTINUOUS FREE LAYER SPIN VALVE SENSOR WITH PATTERNED EXCHANGE UNDERLAYER STABILIZATION

This is a continuation of patent application Ser. No. 09/408,492, filing date Sep. 30, 1999 now U.S. Pat. No. 6,385,017, entitled, Continuous Free Layer Spin Valve Sensor With Patterned Exchange Underlayer Stabilization, assigned to the same assignee as the present invention.

BACKGROUND OF THE INVENTION

1. Field of the Invention

This invention relates to magnetoresistive (MR) sensors and more particularly to MR sensor devices and methods of fabrication thereof.

2. Description of Related Art

Kim et al., U.S. Pat. No. 5,608,593 for "Shaped Spin Valve Type Magnetoresistive Transducer and Method for Fabricating the Same Incorporating Domain Stabilization Technique" shows a spin valve (SV) with a permanent magnet with a non-magnetic (e.g., Cr) underlayer (Separation layer). (See col. 5, lines 15 to 25.)

Ravipati, U.S. Pat. No. 5,709,358 for a "Spin Valve Magnetoresistive Transducers Having Permanent Magnets" has thin film layers of ferromagnetic material separated from each other by a nonmagnetic spacer. The direction of magnetization of one thin ferromagnetic layers is pinned by a permanent magnetic layer. Another permanent magnetic layer is located adjacent to the other thin film layer to provide longitudinal biasing.

Mauri, U.S. Pat. No. 5,796,561 for a "Self-biased Spin Valve Sensor" discloses a Spin Valve (SV) MagnetoResistive (MR) sensor with a free layer separated from a pinned layer by a spacer layer.

Takada et al., U.S. Pat. No. 5,828,527 for a "Thin Film Magnetic Head Having Magnetic Resistance Effect Stabilizing Layer" describes a thin film magnetic head with a magnetoresistance effect stabilizing layer with an underlayer of Ta or oxides of Al or Si, a buffer layer of chromium (Cr), a separation layer of Cr or Ta and a hard magnetic layer.

SUMMARY OF THE INVENTION

A spin valve device comprises a free layer, a spacer layer, a pinned layer, an antiferromagnetic layer, and a patterned underlayer that includes a magnetic material for providing trackwidth and longitudinal bias. The patterned underlayer can comprises a buffer layer, an antiferromagnetic layer and a ferromagnetic layer. Alternatively, the patterned underlayer can comprises a buffer layer, a chromium layer and a magnetically hard, i.e. permanently magnetic, layer which provides trackwidth, longitudinal bias, and magnetic stabilization.

In accordance with this invention a continuous fee layer spin valve (SV) Sensor with a patterned exchange underlayer stabilization. The underlayer (antiferromagnet) is formed under the magnetically hard or permanently magnetic (PM) material.

BRIEF DESCRIPTION OF THE DRAWINGS

The foregoing and other aspects and advantages of this invention are explained and described below with reference to the accompanying drawings, in which.

DESCRIPTION OF THE PREFERRED EMBODIMENT

Figure 1:
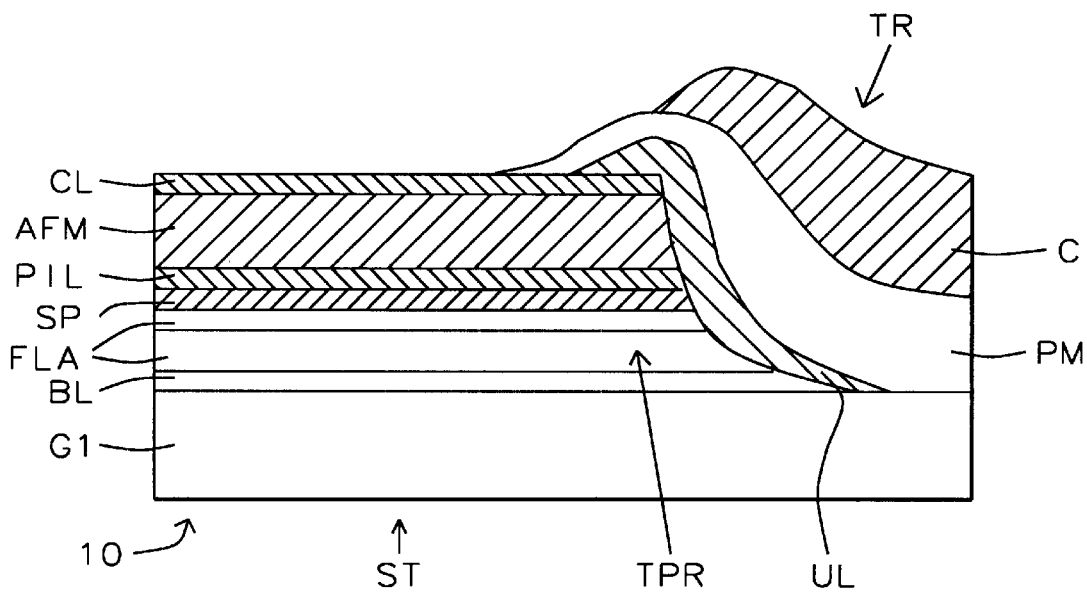
FIG. 1 illustrates a technique using an abutted junction with a sputtered permanent magnet.

One of major challenges of spin valve (SV) and AMR magnetic recording head is the problem of domain stabilization. One technique is to use an abutted junction with sputtered permanent magnet (PM), as illustrated by FIG. 1. The device of FIG. 1 includes a gap layer G1, a buffer layer BL, a pair of FerroMagnetic (FM) free layers FLA, a spacer layer SP, a FerroMagnetic (FM) pinned layer PIL, an AntiFerroMagnetic layer AFM, and a tantalum (Ta) Cap Layer CL in a stack.

On the right side of the stack there is a trench TR which has been filled with permanent magnet PM which provides a hard biasing function. Trench TR has a tapered sidewall extending down through the layers including Cap Layer CL, AntiFerroMagnetic layer AFM, pinned layer PIL, spacer layer SP, free layers FLA, and buffer layer BL to the surface of the gap layer G1.

In the trench, a set of layers is formed partially overlapping the right edge of the surface of the Cap Layer CL starting with an underlayer UL for the next layer which is a hard biasing, permanent magnet layer PM, which in turn is covered by a conductor C. The problem with this design is the uncertain magnetic and structural properties of the tapered region TPR near the junction between the stack ST and the underlayer UL and the hard biasing permanent magnet PM, and conductor C. Great efforts are needed for optimizing the stencil profiles, height and undercut, ion milling angle and depth, deposition conditions of the hard biasing, permanent magnet layer PM and its underlayer to obtain stable devices.

First Embodiment

Figure 2:
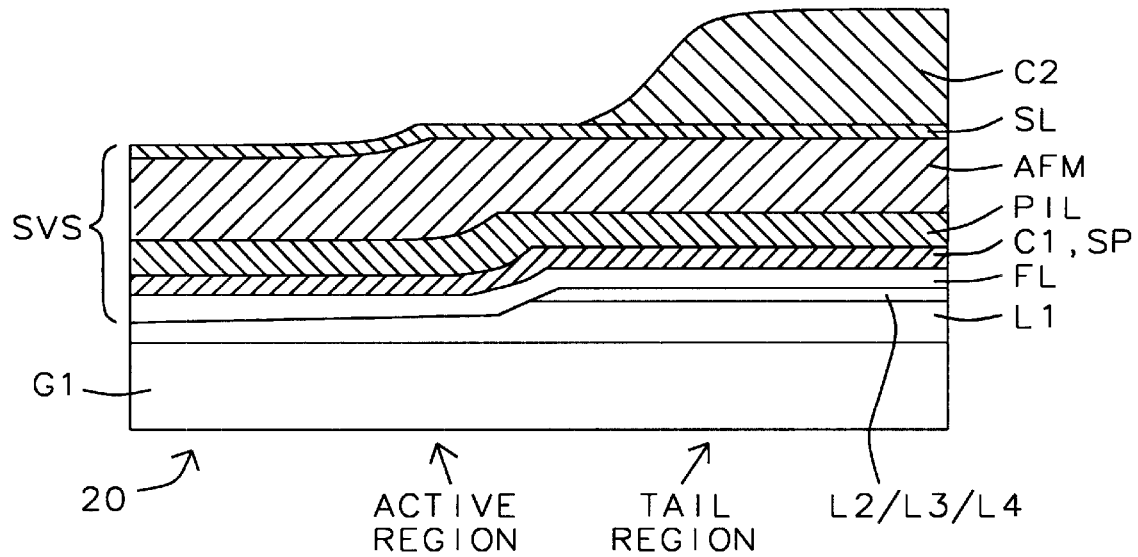
FIG. 2 shows an embodiment in accordance with this invention eliminating the uncertainty of taper properties by using a continuous free layer approach.

FIG. 2 shows an embodiment in accordance with this invention eliminating the uncertainty of taper properties by using a continuous free layer approach. Longitudinal biasing is provided by exchange coupling of a tail region free layer FL to patterned exchange underlayers L1–L4.

In the case of the embodiments of this invention shown in FIGS. 3A–3E and FIGS. 4A–4E, the layers L1–L4 of FIG. 2 are as follows:

Layer L1

The bottom, buffer layer L1 is a composed of a material such as a thin refractory metal layer, preferably tantalum, which can promote a very strong (111) texture of the free layer FL which is mostly composed of NiFe. Alternative refractory metals for buffer layer L1 are Nb, Ta, Ti, Zr, Hf, Mo, and W.

The underlayer L1, has three additional purposes:
1) to provide a milling stop layer,
2) to confine the redeposition to be metal during ion milling,
3) to provide a proper seed layer for (SV).

At the active region, the remaining portion of buffer layer L1 (tantalum, etc.) serves as a buffer layer to promote proper film structure (very strong (111) texture of the free layer, mostly NiFe) in a spin valve SV to obtain a high value of the change in the resistivity ratio which follows:

$$\frac{\text{delta rho}}{\text{rho}},$$

where rho represents resistivity,

Layer L2

The second layer L2 is optional and comprises a conductor C1 which is included in some cases to reduce lead resistance. The material is selected from the group consisting of Au, Ag, W, Mo, Rh, Ru, Ti, β-Ta, TiW, TaW, and $Cu_{50}Au_{50}$.

In the case of the embodiments of FIGS. 5A–5E and FIGS. 6A–6E, the material layer L2 is omitted from the drawings.

Layer L3

The third layer L3 is either a first AntiFerroMagnetic layer AFM1 in the embodiments of FIGS. 3A–3E and FIGS. 4A–4E, or a chromium layer CR in the embodiments of FIGS. 5A–5E and FIGS. 6A–6E.

Layer L3 is a first AntiFerroMagnetic layer AFM1 in the embodiments of FIGS. 3A–3E and FIGS. 4A–4E is selected from three groups consisting of as follows:
(A) IrMn, RhMn, RuMn, RuRhMn, FeMn, FeMnRh, FeMnCr, CrPtMn, TbCo,
(B) NiMn, PtMn, PtPdMn, and
(C) NiO, CoO, CoNiO.

Layer L3 is a chromium (Cr) layer preferably with a thickness of 50 Å in the embodiments of FIGS. 5A–5E and FIGS. 6A–6E.

Layer L4

Layer L4 is a thin ferromagnetic, NiFe layer TFM in the embodiments of FIGS. 3A–3E and FIGS. 4A–4E or layer L4 is a hard biasing, permanent magnetic layer PM in the embodiments of FIGS. 5A–5E and FIGS. 6A–6E.

For FIGS. 3A–3E and FIGS. 4A–4E, during the deposition of the L4 (FM) and SV stack thereabove, the layer L4 with layer L3 Group (A) and (C) AFM1 materials of an alignment field is required and a field annealing at later process step after the spin valve (SV) is completed to set the pinning direction of AFM1 longitudinally. For Group (B) AFM material, a field annealing at some specified angle and higher temperature is needed between process step 1 and 2 to get final pinning direction of AFM1 to be longitudinal. The final configuration is shown in FIG. 2.

Figure 3A:
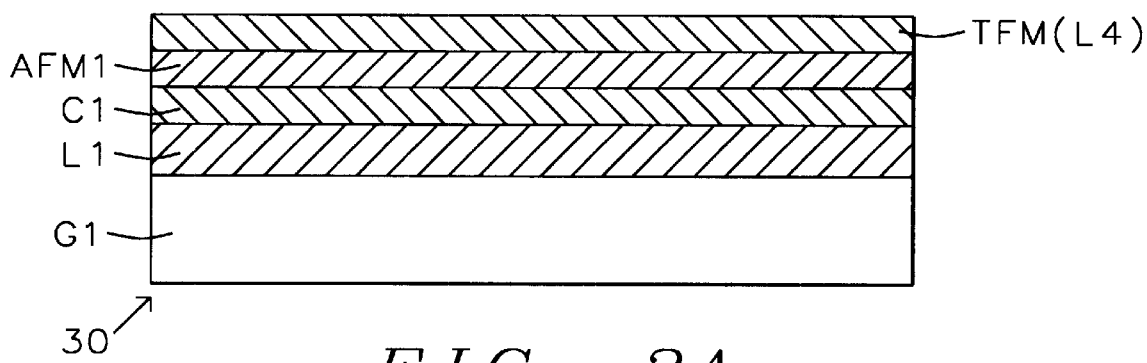
FIGS. 3A–3E show the process steps for forming a second embodiment of the device of FIG. 2.

The second embodiment of the invention of FIG. 2 is shown by FIGS. 3A–3E, which includes the process steps as follows:

1. Referring to FIG. 3A, a device 30 includes an aluminum oxide ($Al_2O_3$) gap layer G1. On the surface of gap layer G1 are deposited blanket layers of a refractory, buffer layer L1, a conductor layer C1, an antiferromagnetic (L3) layer AFM1 and a thin ferromagnetic (NiFe) layer L4. Layers L1, C1, AFM1 and L4 are deposited with the compositions defined above. On top of antiferromagnetic (L3) layer AFM1, a thin ferromagnetic layer (L4) can be sputtered at the same to increase the longitudinal biasing strength. The ferromagnetic layer (L4) is strongly coupled to AFM1 layer L3 and is optional.

Figure 3B:
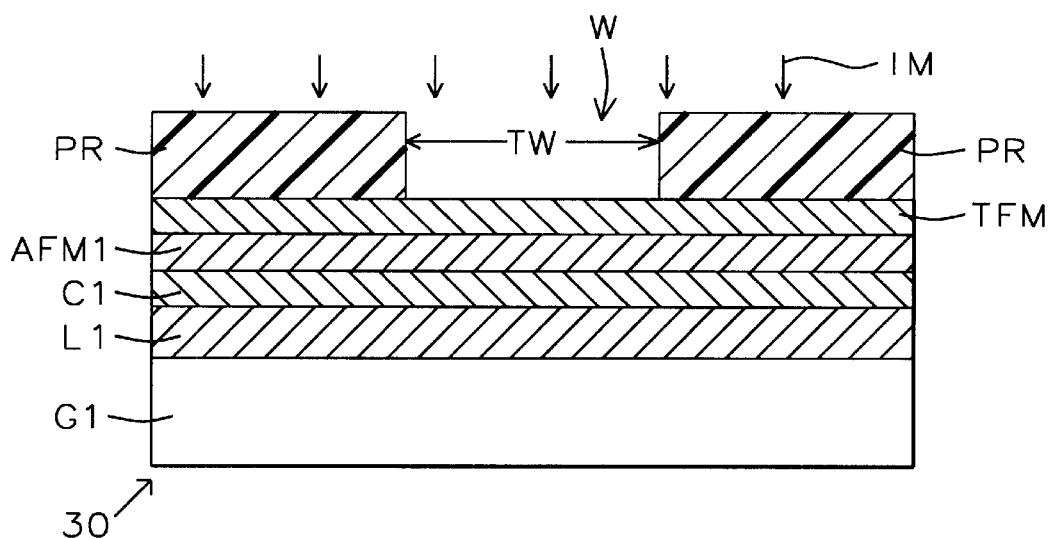

2. Referring to FIG. 3B, the device 30 of FIG. 3A is shown a photoresist layer PR was spun onto the top of layer TFM on top of device 30, and photoresist layer PR was patterned and developed with a window W with a track width TW.

3. Next ion milling with ions IM is performed to mill through layers TFM/AFM1/C1 (L4/L3/L2).

Figure 3C:
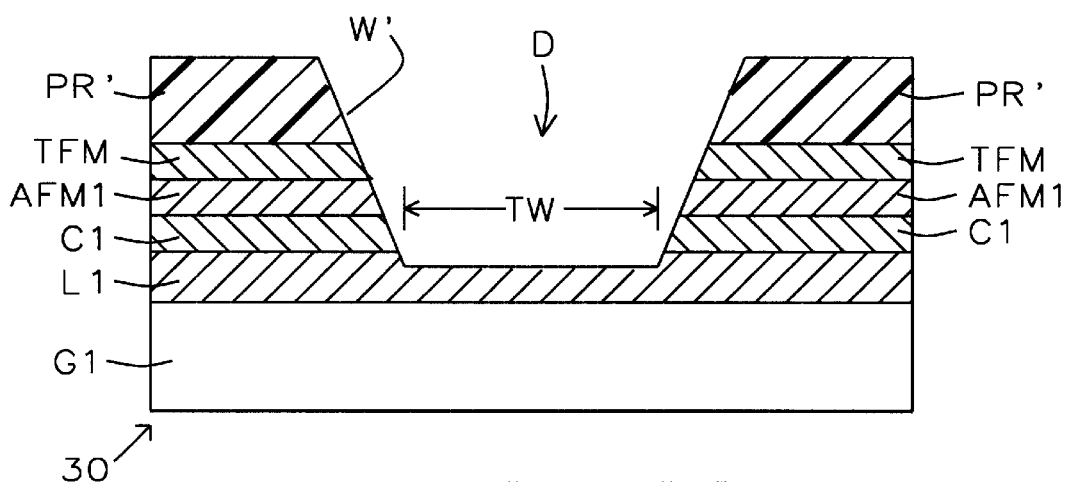

4. Referring to FIG. 3C, the device 30 of FIG. 3B is shown after the ion milling continued to form a tapered window W' in the photoresist PR which has been milled to a thinner layer PR' with a wider opening, and below the window W' extends an inwardly tapered depression D through the thin ferromagnetic (NiFe) layer L4, antiferromagnetic (L3) layer AFM1 and a and conductor layer C1, stopping in the middle of layer L1 with layer L1 serving as an ion milling stop layer forming the bottom of window W'.

Figure 3D:
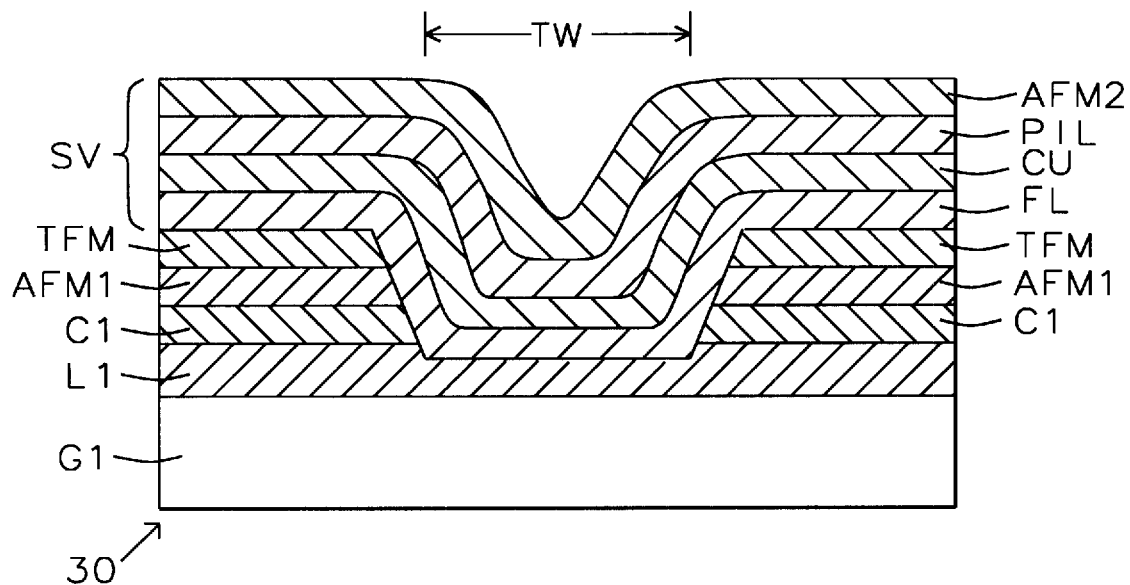

5. Referring to FIG. 3D, the device 30 of FIG. 3C is shown after the remaining photoresist PR' was stripped and the full spin valve stack SV has been deposited. After sputter etching the surface of L1 was cleaned at the active region in window W' and the surface of layer Thin FerroMagnetic layer TFM (L4) was cleaned or the surface of layer AFM1 (L3) was cleaned at the tail region. At the tail region, the free layer is strongly coupled to layer TFM (L4) or layer AEM1 (L3), providing longitudinal stabilization which eliminates side reading. The next process steps lead towards formation of the product seen in FIG. 3E.

6. Form a blanket deposit of a free layer FL (NiFe, CoFe, etc.) over the layer TFM. The free layer FL is strongly exchange coupled to the first antiferromagnetic layer AEM1 to diminish side reading of the sensor and provide longitudinal biasing.

7. Form a blanket deposit of a copper (Cu) layer CU over the free layer FL.

8. Form a blanket deposit of a pinned layer PIL over the blanket copper (Cu) layer CU.

9. Form a blanket deposit of a second antiferromagnetic layer AFM2 composed of PtMn, PtPdMn, IrMn, etc. over the pinned layer PIL.

The group of materials for antiferromagnetic (L3) layer AFM1 are the same materials as the materials for the second antiferromagnetic layer AFM2, i.e. materials selected from the group consisting of PtMn, PtPdMn, IrMn, and so forth.

For the Group (A) and (C) AFM material, an alignment field is required during deposition of layer FM (L4) and a spin valve stack SV, and a field annealing at later process step after spin valve stack SV is completed to set the pinning direction of AFM1 longitudinally.

For Group (B) AFM material, a field annealing at some specified angle and higher temperature is needed between process step 1 and 2 to get the final pinning direction of AFM1 to be longitudinal.

Figure 3E:
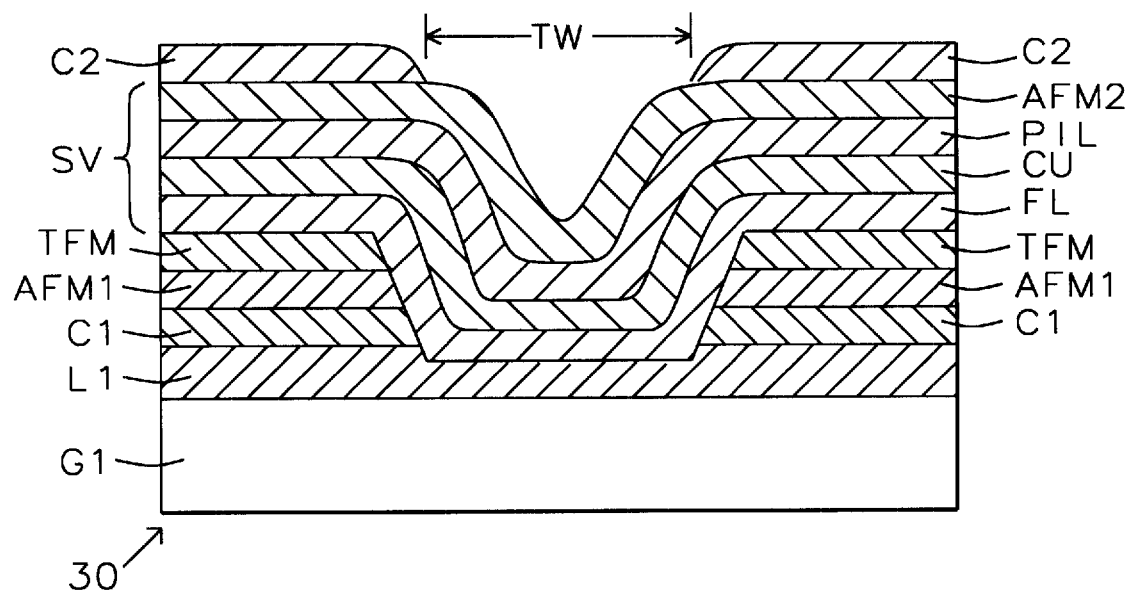
Figure 4A:
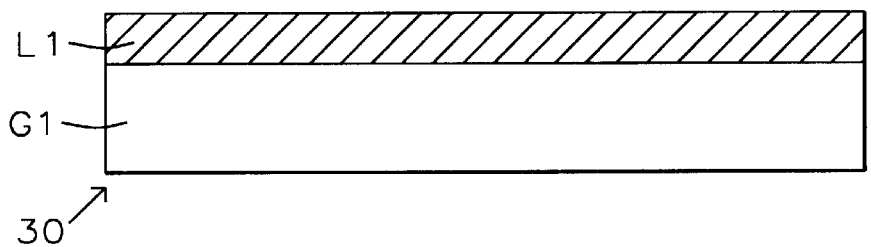
FIGS. 4A–4E show the process steps for forming a third embodiment of the device of FIG. 2.
Figure 4B:
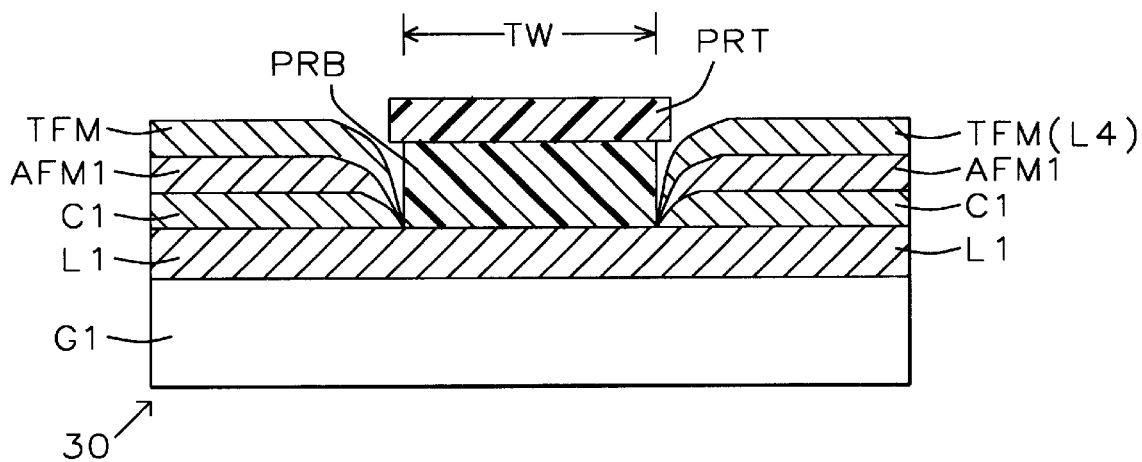
Figure 4C:
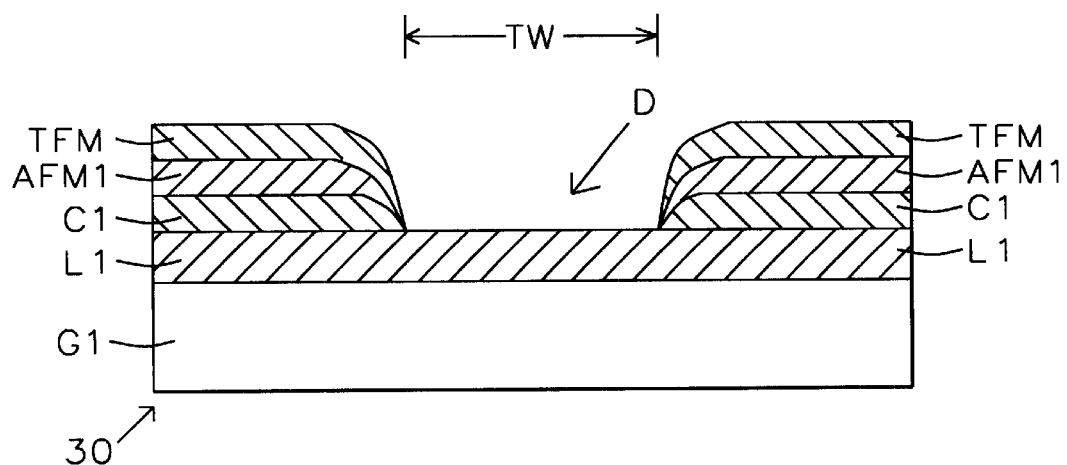

10. Referring to FIG. 3E, the device 30 of FIG. 3D is shown in the form of a preferred embodiment of this invention. A patterned conductor C2 is formed aside from the track width TW, above the recess in the underlayer L1 where the underlayer L1 is thinned at the bottom of window W' as described in connection with FIG. 3C in the central potion of the spin valve stack SV. This leaves the head exposed between the portion of conductor C2 on the sides in order to reduce total lead resistance. The additional conductor layer C2 is deposited with a liftoff process using a photoresist stencil that is aligned to the trackwidth TW defining pattern using a process similar to what is shown in FIGS. 4A–4C below, as will be well understood by those skilled in the art. Conductor layer C2 is especially needed in cases in which there is no C1 conductor layer.

In the case of NiMn, PtMn, PtPdMn as layer AFM1, field annealing performed at high temperature and some specified angle is required to form longitudinal biassing of the tail region, after all the annealing of the SV is done, (the layer AFM2 is annealed in the HA direction.) In the case of IrMn, etc. serious low temperature magnetic setting may be needed at a later stage to properly set the longitudinal biassing direction.

An alternative process to create a device 30 with an exchange underlayer is by using a lift off process as illustrated by FIGS. 4A–4E.

Figure 4D:
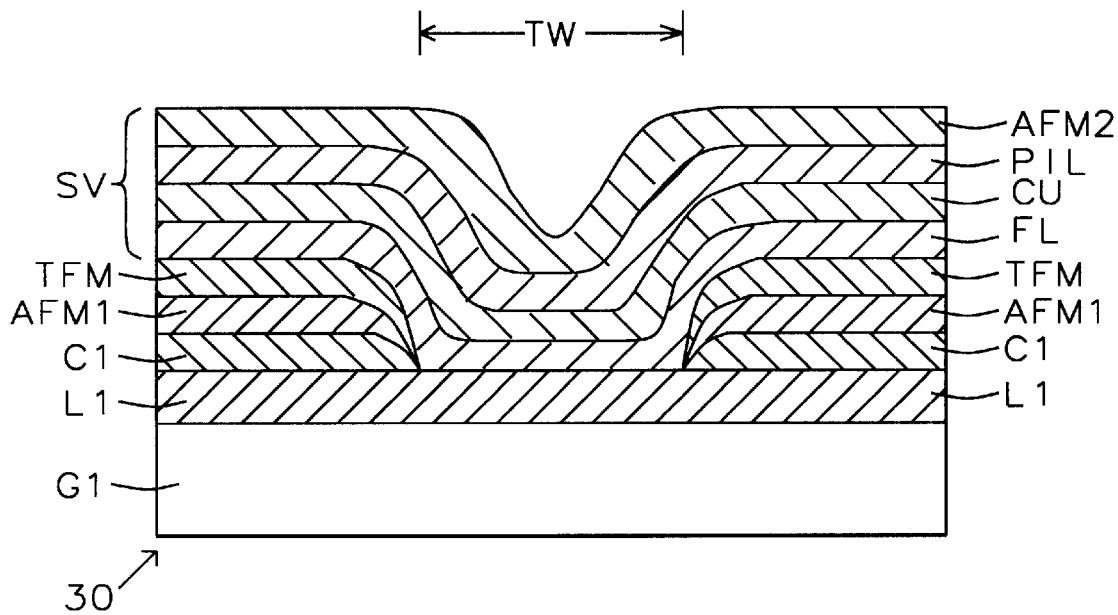
Figure 4E:
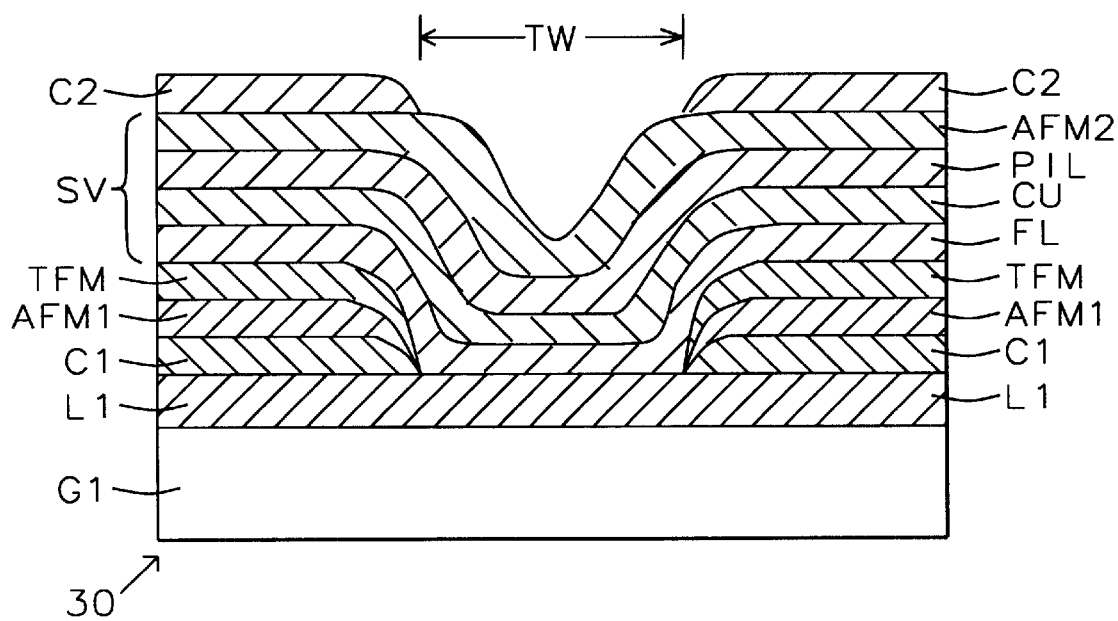

1. FIG. 4A shows the alternative device 30 after depositing the refractory metal (Ta) layer L1 in an initial stage of manufacture.
2. In FIG. 4B, the device 30 of FIG. 4A is shown after a photoresist stencil stack has been formed. The stencil stack includes a bottom portion PRB with width TW and upper stencil PRT with an overlay provided by a greater width than width TW developed. Then the next (L2/L3/L4) layers C1/AFM1/TFM are sputtered aside from the bottom portion PRB with rounded sidewalls of the layers C1/AFM1/TFM adjacent to the bottom portion PRB provided by the overhang of the upper stencil PRT.
3. In FIG. 4C, the device 30 of FIG. 4B is shown after the photoresist stencil PR was lifted off to leave the depression D with correct active region dimension and with the rounded, tapered sidewalls of the layers C1/AFM1/TFM remaining adjacent to the depression D and with the top surface of underlayer L1 exposed below the depression D.
4. In FIG. 4D, the device 30 of FIG. 4C is shown after the whole spin valve stack SV was deposited as described in the previous embodiment. The exposed surface of the underlayer L1 and the rounded, sidewalls of layer TFM are covered with rounded, sidewalls of the blanket deposit of the free layer FL, the blanket deposit of the copper layer CU, the blanket deposit of the pinned layer PL and the blanket deposit of the antiferromagnetic layer AFM2.
5. Referring to FIG. 4E, the device 30 of FIG. 4D is shown after a patterned conductor C2 was formed aside from the track width TW, and the rounded sidewalls of layers FL/CU/PIL/AFM2 above the recess in the underlayer L1 where the underlayer L1 is thinned at the bottom of window W' as described in connection with FIG. 3C in the central portion of the spin valve stack SV. This leaves the head exposed within the track width TW between the portions of conductor C2 on the sides in order to reduce total lead resistance. The additional conductor layer C2 is deposited with a liftoff process using a photoresist stencil that is aligned to the trackwidth TW defining pattern using a process similar to what is shown in FIGS, 4A–4C above, as will be well understood by those skilled in the art. Conductor layer C2 is especially needed in cases in which there is no C1 conductor layer.

Advantages of Second and Third Embodiments

The advantages of the second embodiment of the invention of FIG. 2 seen in FIG. 3E and the third embodiment of the invention of FIG. 2 seen in FIG. 4E are as follows:
1. The free layer FL is continuous. The sensor region is longitudinal with biasing regions which are made of the same material and there is no disruption in magnetic and physical properties between them unlike abutted junction design of FIG. 1 (no tapered region).
2. The same material like IrMn can be made very thin 50 Å to about 80 Å to have very high exchange. Then the shadowing effect of the ion milling process can be minimized.
3. Except for the sensor region, all the rest of the free layer is strongly coupled to the AFM1 layer to make it capable of not being responsive to external fields and providing a robust recording head.

Modifications of Second and Third Embodiments

Figure 8:
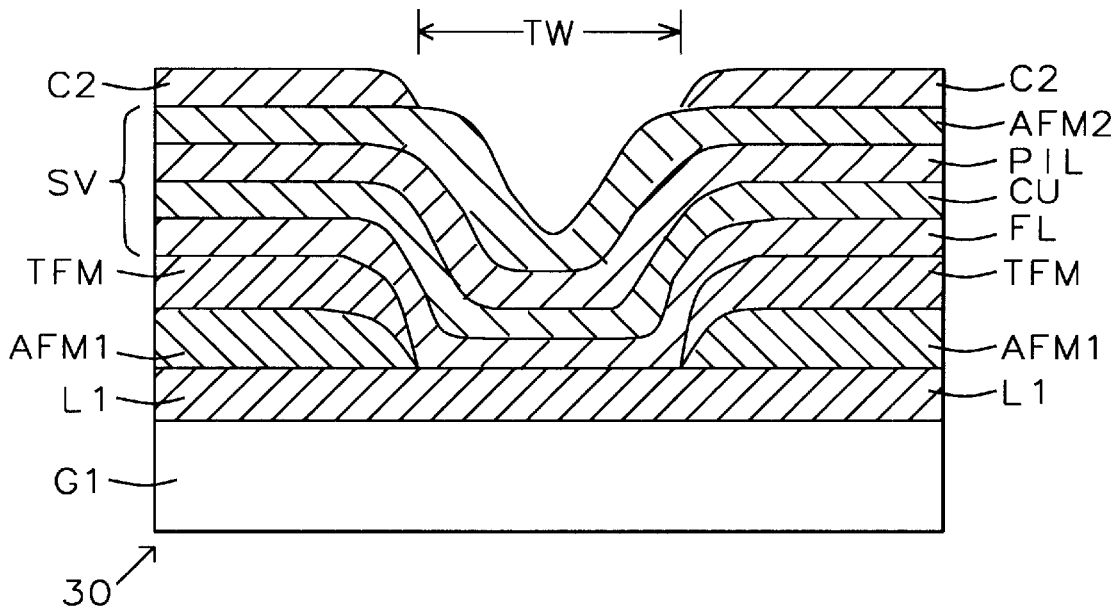
In FIG. 8, the first conductor layer of FIG. 3E and FIG. 4E was eliminated so that the first antiferromagnetic layer is formed directly on the buffer layer eliminating the second layer formed above the gap material.

Referring to FIG. 8, the first conductor layer C1 of FIG. 3E and FIG. 4E was eliminated and the first antiferromagnetic layer AFM1 was formed directly on the buffer layer L1, eliminating first conductor layer C1 (i.e. the second layer L2) formed on the gap material G1.

Figure 9:
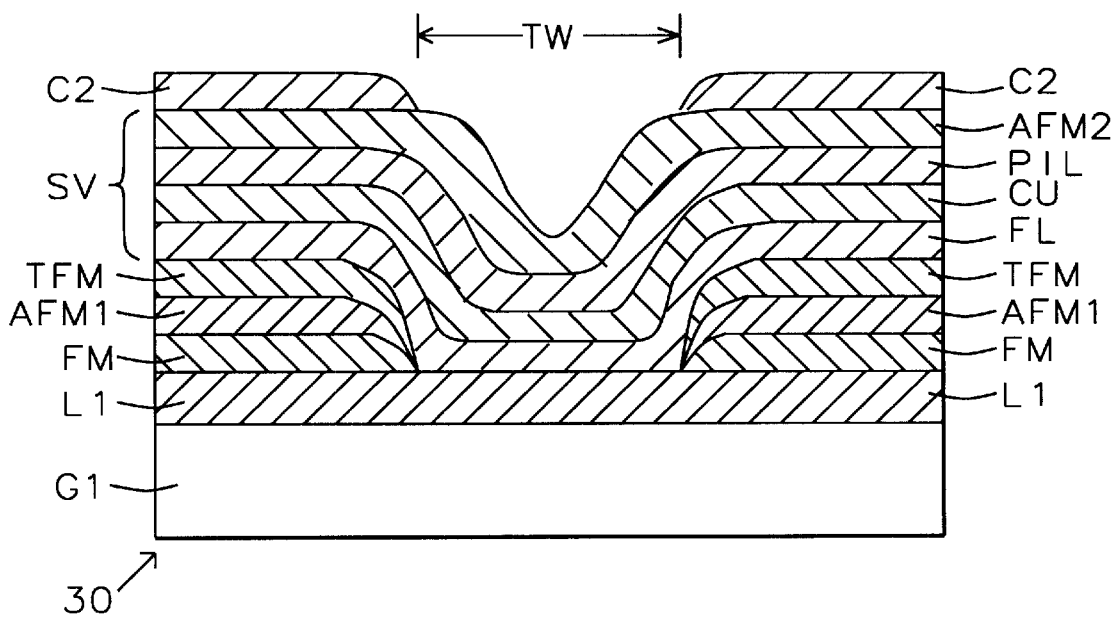
In FIG. 9, the first conductor layer of FIG. 3E and FIG. 4E has been replaced by a thin, ferromagnetic layer FM formed directly on the buffer layer L1 to promote growth.

Referring to FIG. 9, the first conductor layer C1 of FIG. 3E and FIG. 4E was replaced by a thin, ferromagnetic layer FM formed directly on the buffer layer L1 to promote growth.

Fourth Embodiment

In the fourth embodiment of the device of FIG. 2 shown in FIGS. 5A–5E, the process steps are the same as for FIGS. 3A–3E except that layer L3 is a chromium layer CR and layer L4 is a hard biasing, permanent magnetic layer PM as described above.

In this embodiment the uncertainty of taper properties is again eliminated by using the continuous free layer approach. The longitudinal biasing is provided by a hard biasing, permanent magnet (PM) underlayer that is deposited as a full film with well controlled film properties. The process steps are listed in the attached notes. At the first step, a thin refractory metal underlayer (L1), an optional conductor layer C1 (L2), and chromium underlayer CR (L3) for layer PM (L4) are deposited as full, blanket films. Then in FIG. 5B, a photoresist layer PR is spun on, exposed to a patterning mask and developed with the correct track width TW. Then ion milling IM is performed to mill through layers (L4/L3/L2) L1/C1/CR/PM and stop at middle of the underlayer L1 forming depression D and thinning mask PR to thickness and configuration of remaining mask PR'.

Figure 5A:
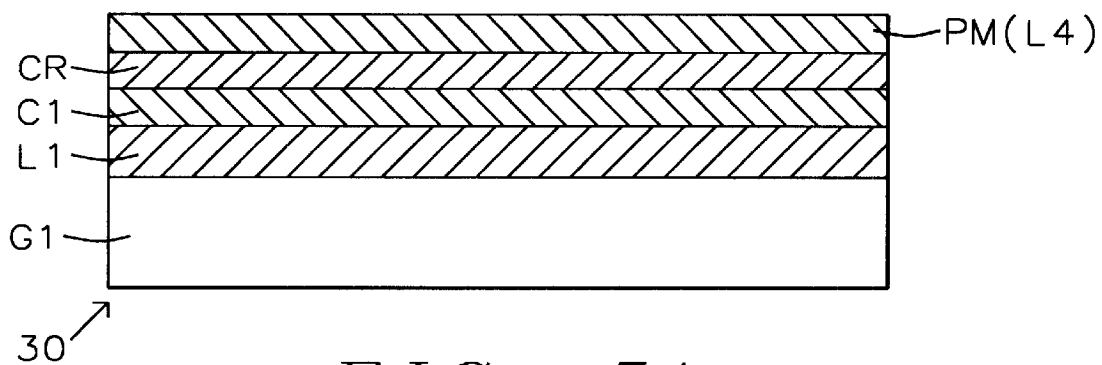
FIGS. 5A–5E show the process steps for forming a fourth embodiment of the device of FIG. 2.
Figure 5B:
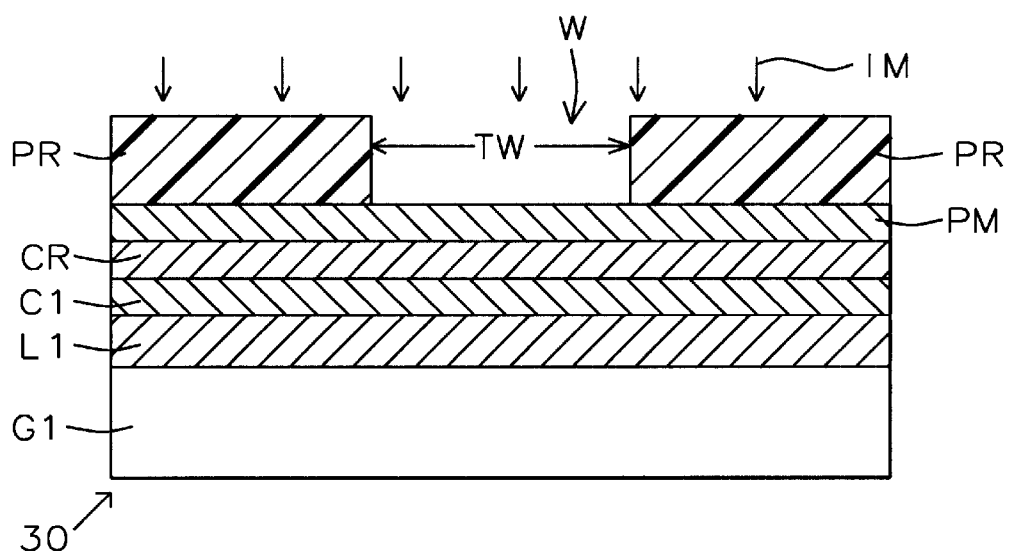
Figure 5C:
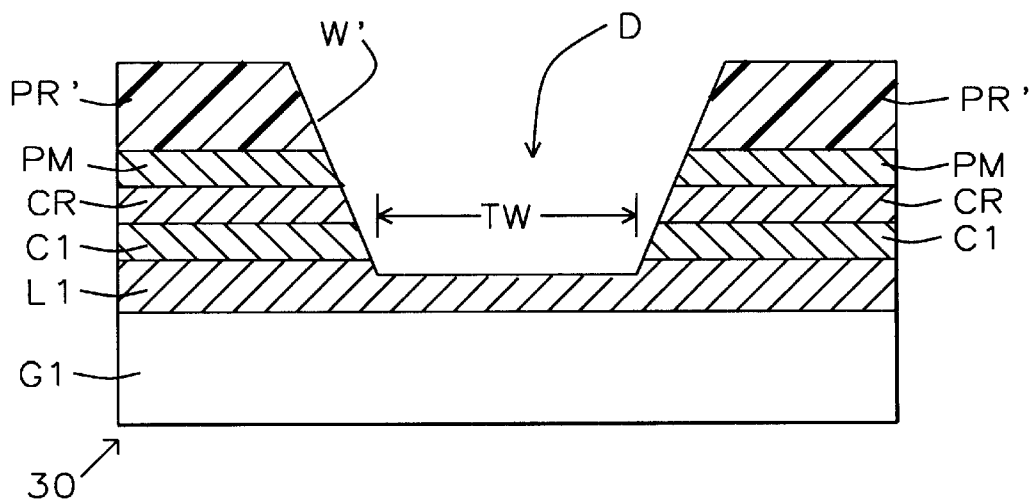

Then in FIG. 5C the remaining photoresist mask PR' is stripped. After sputter etch cleaning the surface of layer L1 at the active region and layer PM (L4) at the tail region, in FIG. 5D, the full spin valve stack SV is deposited. At the active region in depression D, the remaining thickness of layer L1 serves as a buffer layer to promote proper film structure (very strong (111) texture of free layer, mostly NiFe) in SV to obtain high delta rho/rho. At the tail region, the free layer can be ferromagnetic coupled to PM (L4) if no additional refractory buffer layer is included in SV stack, or is simply magnetostatically coupled to PM. The PM can be either longitudinal or vertically magnetized to provide longitudinal stabilization to the active sensor region while eliminates side reading. The underlayer L1 is thinned at the bottom of depression D in the window W', where the full spin valve stack SV is to be deposited so that there is a recess in the underlayer L1 below the central portion of the spin valve stack SV. Then there is a blanket deposit of a free layer FL (NiFe, CoFe, etc.) over the layer TFM. The free layer FL is strongly exchange coupled to the first antiferromagnetic layer AFM1 to diminish side reading of the sensor and to provide longitudinal biasing, followed by forming a blanket deposit of a copper (Cu) layer CU over the free layer FL, followed by a blanket deposit of a pinned layer PIL over the blanket copper (Cu) layer CU, followed by a blanket deposit of a second antiferromagnetic layer AFM2 composed of PtMn, PtPdMn, IrMn, etc. over the pinned layer PIL.

Figure 5D:
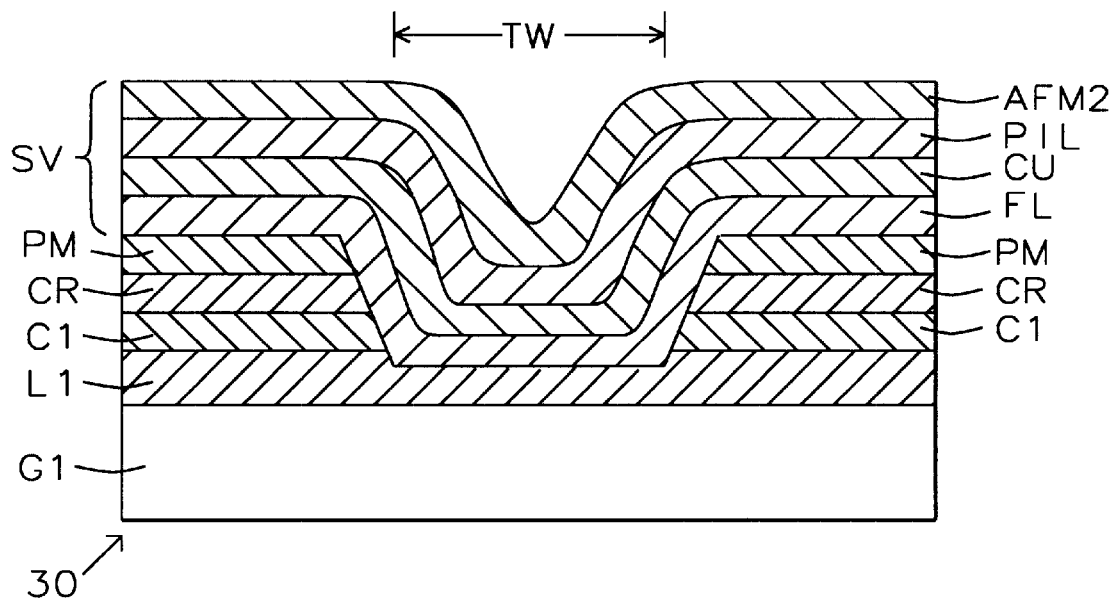
Figure 5E:
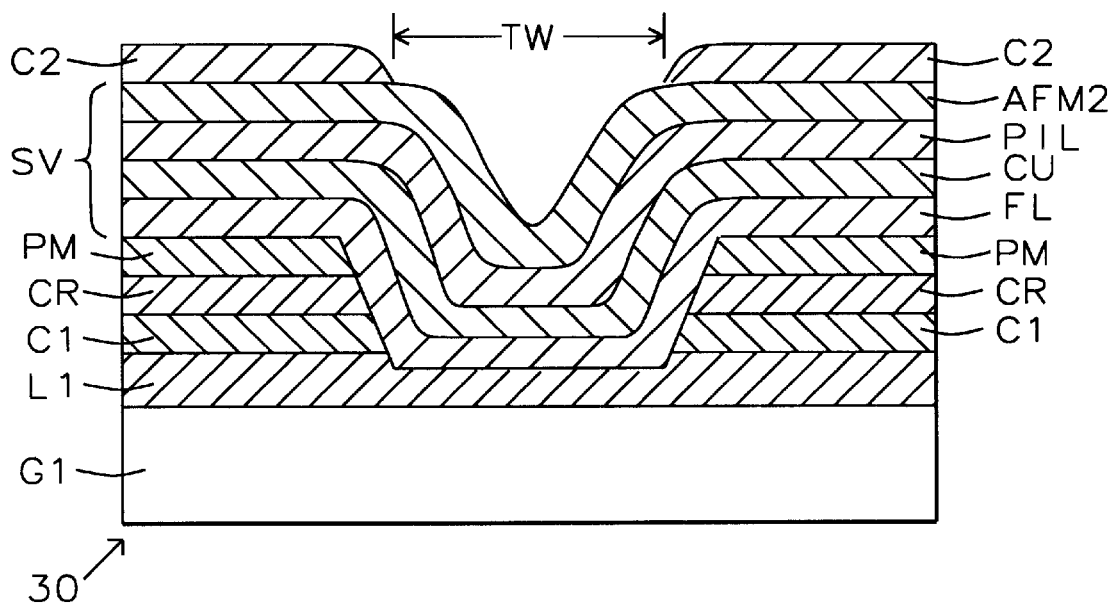

Referring to FIG. 5E, the device 30 of FIG. 5D is shown in the form of a preferred embodiment of this invention. A patterned conductor C2 is formed aside from the track width TW, above the recess in the underlayer L1 where the underlayer L1 is thinned at the bottom of window W' as described in connection with FIG. 3C in the central portion of the spin valve stack SV. This leaves the head exposed between the portions of conductor C2 on the sides in order to reduce total lead resistance. The additional conductor layer C2 is deposited with a liftoff process using a photoresist stencil that is aligned to the trackwidth TW defining pattern using a process similar to what is show in FIGS. 4A–4C above, as will be well understood by those skilled in the art. Conductor layer C2 is especially needed in cases in which there is no C1 conductor layer.

The L1 layer has three purposes: 1) to provide a milling stop layer, 2) to confine the redeposition to be metal during ion milling, 3) to provide a proper seed layer for SV. Its material can be chosen from refractory metal: Nb, Ta, Ti, Zr, Hf, Mo and W.

Layer L2 is optional for reduction of lead resistance. Layer L2 can be made of a material chosen from the following: Au, Ag, W, Mo, Rh, Ru, Ti, β-Ta, TiW, TaW, $Cu_{50}Au_{50}$.

Longitudinally permanent magnetic layer PM in FIGS. 5A–5E can be one of Co, CoPt, CoSm, CoPtCr, CoCrTa, CoPtB, CoCrTaPt, and CoCrPtB.

For vertically magnetized PM, the underlayer can be omitted and its material should be one of Co, CoCr, CoSm, and Ba-ferrite.

In the TW region, the underlayer provides a good buffer layer. In the tail region, the PM exchange coupling to the free layer stiffens the tail region. The PM provides longitudinal biassing. There are no junctions in the free layer between the active region and the tail region. There is no taper complexity of magnetic and material properties.

Fifth Embodiment

An alternative process to create a device 30 with an exchange underlayer is by using a lift off process as illustrated by FIGS. 6A–6E.

Figure 6A:
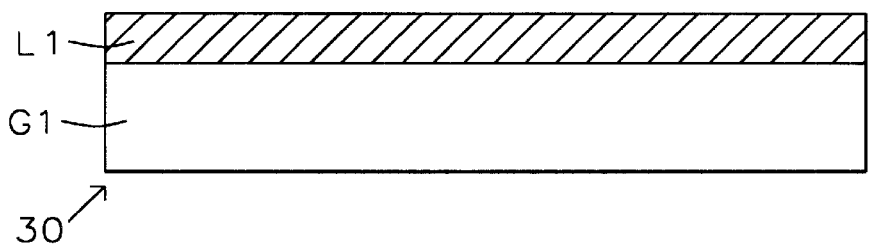
FIGS. 6A–6E show the process steps for forming a fifth embodiment of the device of FIG. 2.
Figure 6B:
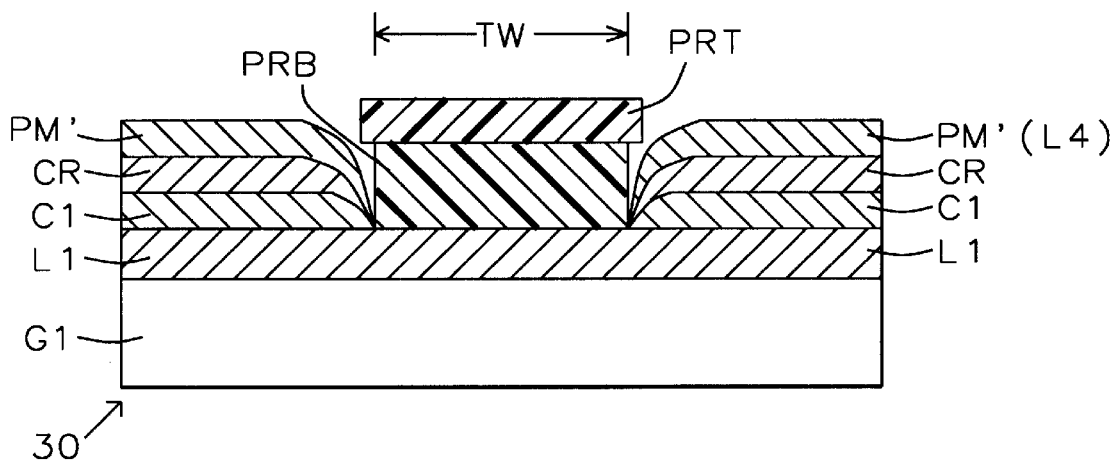
Figure 6C:
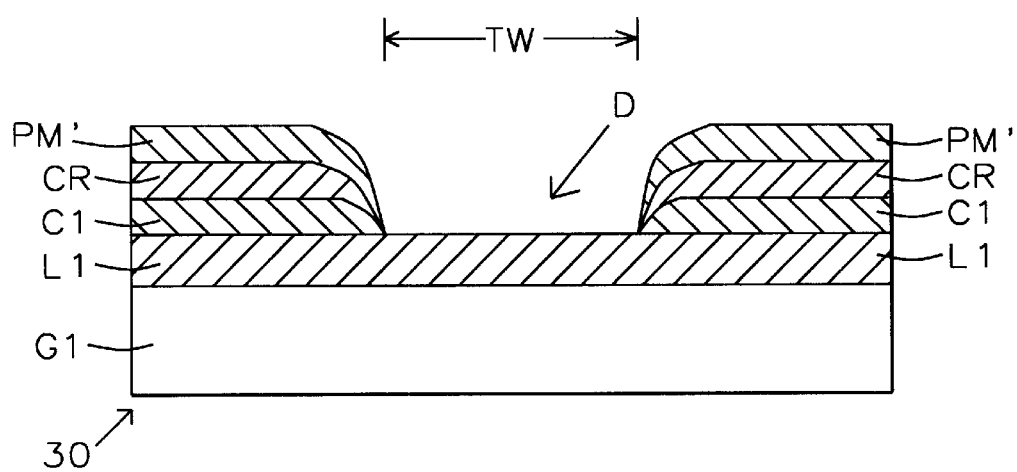
Figure 6D:
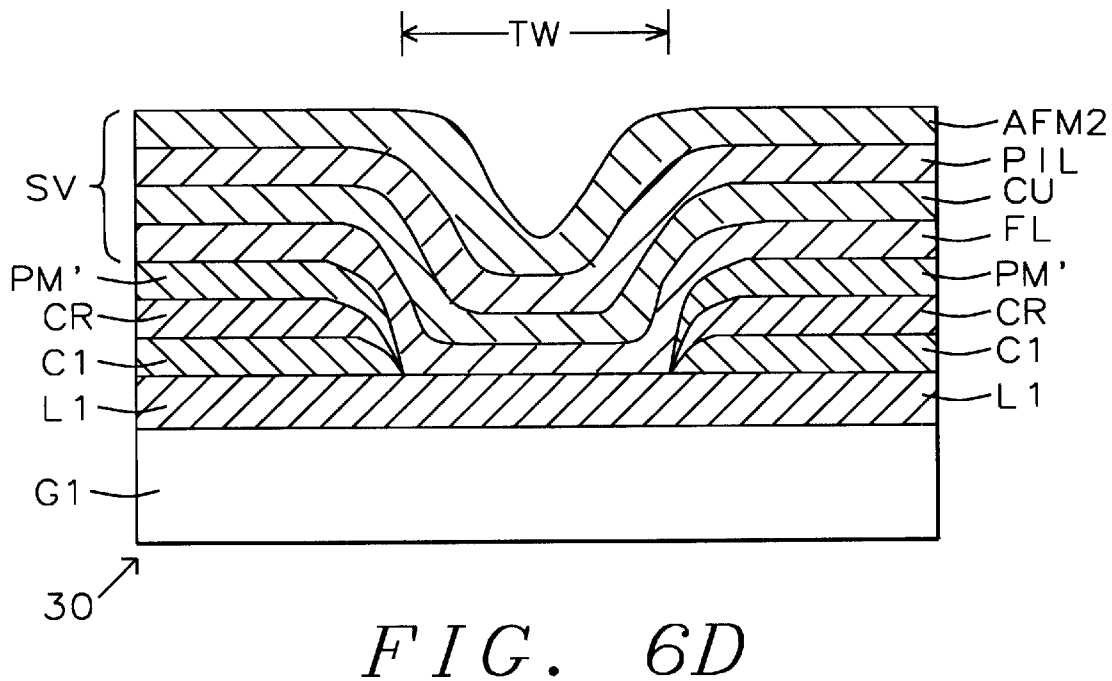
Figure 6E:
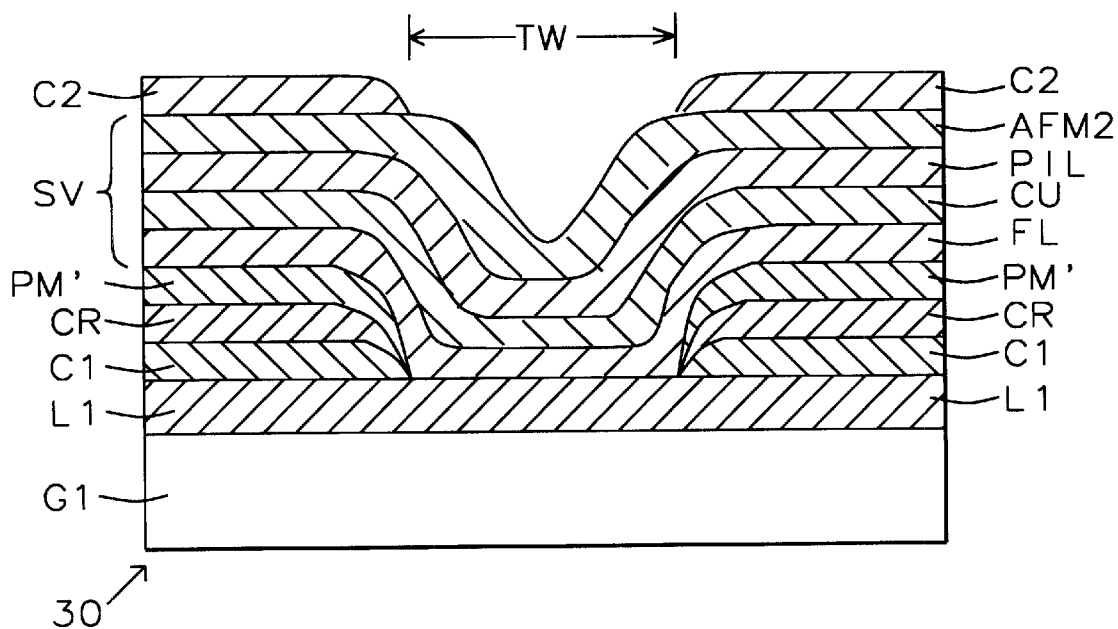

1. FIG. 6A shows the alternative device 30 after depositing the refractory metal (Ta) layer L1 in an initial stage of manufacture.
2. In FIG. 6B, the device 30 of FIG. 6A is shown after a photoresist stencil stack has been formed. The stencil stack includes a bottom portion PRB with width TW and upper stencil PRT with an overlay provided by a greater width than width TW developed. Then the next (L2/L3/L4) layers C1/CR/PM' are sputtered aside from the bottom portion PRB with rounded sidewalls of the layers C1/CR/PM' adjacent to the bottom portion PRB provided by the overhang of the upper stencil PRT.
3. In FIG. 6C, the device 30 of FIG. 6B is shown after the photoresist stencil PR was lifted off to leave the depression D with correct active region dimension and with the rounded, tapered sidewalls C1/CR/PM' remaining adjacent to the depression D with the top surface of underlayer L1 exposed below the depression D.
4. In FIG. 6D, the device 30 of FIG. 6C is shown after whole spin valve stack SV was deposited as described in the previous embodiment. The exposed surface of the underlayer L1 and the rounded, sidewalls of the layer PM' are covered with rounded, sidewalls of the blanket deposit of the free layer FL, the blanket deposit of the copper layer CU, the blanket deposit of the pinned layer PL and the blanket deposit of the antiferromagnetic layer AFM2.
5. In FIG. 6E, the device 30 of FIG. 6D is shown after a patterned conductor C2 is formed aside from the track width TW, and the rounded sidewalls of layers FL/CU/PIL/AFM2 above the recess in the underlayer L1 where the underlayer L1 is thinned at the bottom of window W' as described in connection with FIG. 3C in the central portion of the spin valve stack SV. This leaves the head exposed within the track width TW between the portions of conductor C2 on the sides in order to reduce total lead resistance. The additional conductor layer C2 is deposited with a liftoff process using a photoresist stencil that is aligned to the trackwidth TW defining pattern using a process similar to what is shown in FIGS. 4A–4C above, as will be well understood by those skilled in the art. Conductor layer C2 is especially needed in cases in which there is no C1 conductor layer.

Advantages of Fourth and Fifth Embodiments

The advantages of the fourth and fifth embodiments of the invention illustrated by the embodiment shown in FIG. 2 are as follows:
a) The free layer has no junctions. The magnetic and film properties are continuous from active sensor region to tail stabilization region.
b) The exchange underlayer (L3) and longitudinal biasing enhance layer (L4) film properties are well defined even at edges because they are deposited as full films.
c) The magnetic free layer does not have a taper region.
d) The underlayer (L1) provides a milling stop layer to control the variation of milling depth, and the remaining L1 in active region will serve as a buffer layer to promote good spin valve structure.

Modifications of Fourth and Fifth Embodiments

Figure 10:
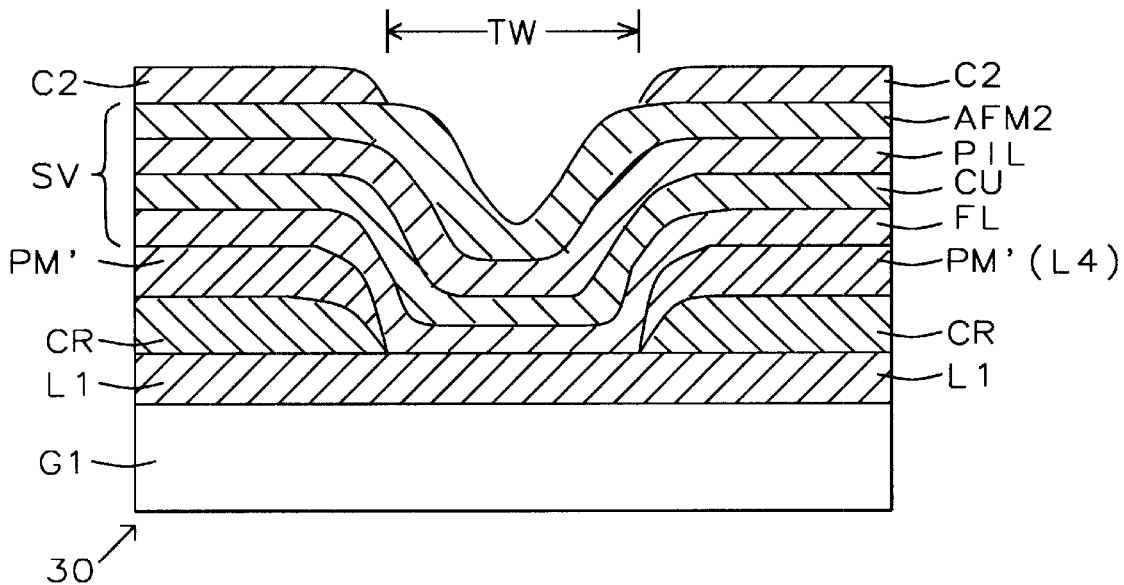
In FIG. 10, the first conductor layer of FIGS. 5E and 6E was eliminated so that the underlayer is formed directly on the buffer layer, eliminating the first conductor layer.

Referring to FIG. 10, the first conductor layer C1 of FIGS. 5E and 6E was eliminated and the chromium underlayer CR was formed directly on the buffer layer L1, eliminating first conductor layer C1 (i.e. the second layer L2).

Figure 11:
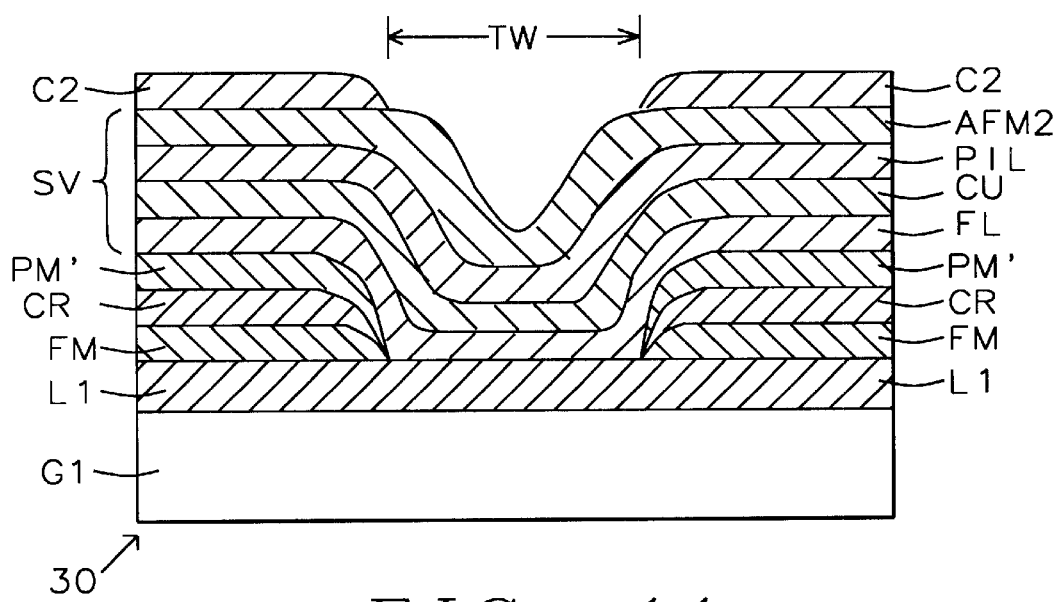
In FIG. 11, the first conductor layer C1 of FIG. 5E and FIG. 6E was replaced by a thin, ferromagnetic layer FM formed directly on the buffer layer L1 to promote growth.

Referring to FIG. 11, the first conductor layer C1 of FIG. 5E and FIG. 6E was replaced by a thin, ferromagnetic layer FM formed directly on the buffer layer L1 to promote growth.

Sixth Embodiment

Figure 7:
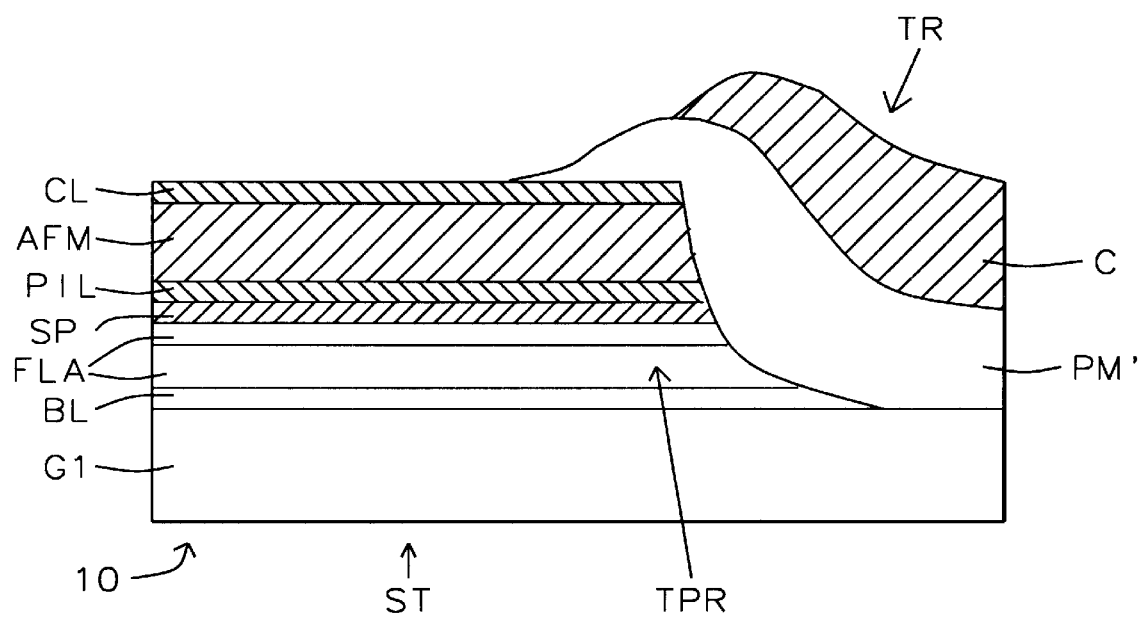
FIG. 7 shows an alternative embodiment of this invention which is a modification of the device of FIG. 1 with replacement of the permanent magnet layer PM and underlayer UL with a perpendicularly oriented, permanently magnetic (hard magnetic) layer PM'.

FIG. 7 shows an alternative embodiment of this invention which is a modification of the device of FIG. 1 with replacement of the hard biasing, permanent magnet layer PM and underlayer UL with a perpendicularly oriented hard biasing, permanent magnet layer PM'. However, the hard biasing, permanent magnet PM' is composed of a material selected from the group consisting of the alloy of cobalt chromium (CoCr), the alloy of cobalt samarium (CoSm), and barium (Ba)-ferrite which has a crystallized anisotropy pointing out the the film plane to form a perpendicular hard biasing, permanent magnet.

Unlike FIG. 1, in FIG. 7 the sputtered hard biasing, permanent magnet layer PM' overlies the surface of a gap layer G1 and forms an abutted junction with a stack of layers including buffer layer BL, a pair of FerroMagnetic (FM) free layers FLA, spacer layer SP, a FerroMagnetic (FM) pinned layer PIL, an AntiFerroMagnetic layer AFM, and a tantalum (Ta) Cap Layer CL in a stack. In other words, on the right side of the stack there is a trench TR which has been filled with hard biasing, permanent magnet PM. Trench TR has a tapered sidewall extending down through the layers including the Cap Layer CL, the AntiFerroMagnetic layer AFM, the pinned layer PIL, the spacer layer SP, the free layers FLA, and buffer layer BL to the surface of the gap layer G1.

In the trench, a set of layers is formed overlapping partially on the right edge of the surface of the Cap Layer CL starting with the hard biasing, permanent magnet layer PM', which in turn is covered by the conductor C.

Preferably, in accordance with this invention, a conductor layer edge is wider than an underlayer edge.

In addition, in accordance with this invention, a conductor layer edge is smaller than an underlayer edge.

While this invention has been described in terms of the above specific embodiment(s), those skilled in the art will recognize that the invention can be practiced with modifications within the spirit and scope of the appended claims, i.e. that changes can be made in form and detail, without departing from the spirit and scope of the invention. Accordingly, all such changes come within the purview of the present invention and the invention encompasses the subject matter of the claims which follow.

Having thus described the invention, what is claimed as new and desirable to be secured by Letters Patent is as follows:

1. A method of forming a spin valve device comprising:
   forming a gap layer,
   forming a buffer layer having a top surface and which comprises a single layer of a refractory material formed on the surface of the buffer layer,
   forming patterned underlayers including a magnetic material for providing trackwidth and longitudinal bias on the buffer layer selected from the group consisting of as follows:
   a) a first antiferromagnetic layer stacked with a ferromagnetic layer, and
   b) a chromium layer stacked with a permanent magnetic layer,
   forming an inwardly tapered depression in the patterned underlayers down to the surface of the buffer layer by a method selected from the steps as follows:
   c) ion milling through a mask and
   d) forming a lift off stencil where the depression is to be located prior to forming the patterned underlayers and lifting off the stencil after forming the patterned underlayers,
   e) forming a stack of layers formed covering the patterned underlayers and reaching down to cover the inwardly tapered depression including:
   forming a free layer,
   forming a pinned layer,
   forming a spacer layer, and
   forming a second antiferromagnetic layer, and
   forming conductors either on a surface of the second antiferromagnetic layer aside from said depression or between the buffer layer and the patterned underlayers.

2. The method of claim 1 wherein:
   the magnetic material in the patterned underlayers comprises a material selected from an antiferromagnetic underlayer and a permanent magnetic underlayer, and
   the trackwidth is defined by dry etching and stopping at the buffer layer.

3. The method of claim 1 wherein:
   the magnetic material in the patterned underlayers comprises an antiferromagnetic underlayer, and
   the trackwidth is defined by liftoff through a photoresist stencil.

4. The method of claim 1 wherein the trackwidth is defined by dry etching and stopping at buffer layer.

5. The method of claim 1 wherein trackwidth is defined by liftoff through a photoresist stencil.

6. The method of claim 1 wherein reduced electrical lead resistance is achieved by adding an aligning conductor layer after spin valve deposition.

7. The method of claim 6 wherein the aligning conductor layer is one of Au, Ag, W, Mo, Rh, Ru, Ti, $\beta$-Ta, TiW, TaW and $Cu_{50}Au_{50}$.

8. The method of claim 1 including a conductor having a layer edge wider than an underlayer edge.

9. The method of claim 1 including a conductor having a layer edge smaller than an underlayer edge.

10. A method of forming a spin valve device comprising:
    forming a gap layer having an upper surface,
    forming a buffer layer having a top surface and which is composed of a single layer of a refractory material over the upper surface of the gap layer,
    forming patterned underlayers including a permanent magnetic material for providing trackwidth, longitudinal bias, and exchange stabilization,
    forming an inwardly tapered depression in the patterned underlayers down to the top surface of the buffer layer by a method selected from the steps as follows:
    a) ion milling through a mask and
    b) forming a lift off stencil where the depression is to be formed prior to forming the patterned underlayers and lifting off the stencil after forming the patterned underlayers,
    forming a stack of layers covering the patterned underlayers and reaching down to cover the inwardly tapered depression including:
    forming a free layer,
    forming a pinned layer,
    forming a spacer layer,
    forming an antiferromagnetic layer having an upper surface, and
    forming conductors either on the upper surface of the antiferromagnetic layer aside from said depression or between the buffer layer and the patterned underlayers.

11. The method of claim 10 wherein:
    the permanent magnetic material in the patterned underlayer is selected from the group consisting of Co, CoPt, CoSm, CoPtCr, CoCrTa, CoPtB, CoCrTaPt, and CoCrPtB, and the trackwidth is defined by dry etching and stopping at a buffer layer.

12. The method of claim 10 wherein:

the permanent magnetic material in the patterned underlayer is selected from the group consisting of Co, CoPt, CoSm, CoPtCr, CoCrTa, CoPtB, CoCrTaPt, and CoCrPtB, and the trackwidth is defined by lift off through photoresist stencil.

13. The method of claim 10 wherein a conductor layer edge is wider than an underlayer edge.

14. The method of claim 10 wherein a conductor layer edge is smaller than an underlayer edge.

15. The method of claim 10 wherein the trackwidth is defined by dry etching and stopping at buffer layer.

16. The method of claim 10 wherein trackwidth is defined by liftoff through a photoresist stencil.

17. The method of claim 10 wherein reduced electrical lead resistance is achieved by adding an aligning conductor layer after spin valve deposition.

18. The method of claim 17 wherein the aligning conductor layer is one of Au, Ag, W, Mo, Rh, Ru, Ti, $\beta$-Ta, TiW, TaW, and $Cu_{50}Au_{50}$.

* * * * *